(12) United States Patent
Yegnashankaran et al.

(10) Patent No.: US 7,042,092 B1
(45) Date of Patent: May 9, 2006

(54) MULTILEVEL METAL INTERCONNECT AND METHOD OF FORMING THE INTERCONNECT WITH CAPACITIVE STRUCTURES THAT ADJUST THE CAPACITANCE OF THE INTERCONNECT

(75) Inventors: Visvamohan Yegnashankaran, Redwood City, CA (US); Gobi R. Padmanabhan, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 4 days.

(21) Appl. No.: 10/010,696

(22) Filed: Dec. 5, 2001

(51) Int. Cl.
*H01L 23/52* (2006.01)

(52) U.S. Cl. .................. 257/758; 257/759; 257/760
(58) Field of Classification Search .............. 257/310, 257/324, 635, 758–760, 639, 640, 641, 642, 257/643, 644; 438/619, 622–624, 761
See application file for complete search history.

(56) References Cited

U.S. PATENT DOCUMENTS

| | | | | |
|---|---|---|---|---|
| 5,640,049 | A | * | 6/1997 | Rostoker et al. ............ 257/758 |
| 6,100,590 | A | * | 8/2000 | Yegnashankaran et al. .. 257/758 |
| 6,207,553 | B1 | * | 3/2001 | Buynoski et al. ........... 438/622 |
| 6,222,269 | B1 | * | 4/2001 | Usami ........................ 257/758 |
| 6,246,118 | B1 | * | 6/2001 | Buynoski .................... 257/758 |
| 6,262,446 | B1 | * | 7/2001 | Koo et al. .................. 257/296 |
| 6,288,447 | B1 | * | 9/2001 | Amishiro et al. ........... 257/758 |
| 6,294,834 | B1 | * | 9/2001 | Yeh et al. ................... 257/758 |
| 6,362,531 | B1 | * | 3/2002 | Stamper et al. ............. 257/781 |
| 6,437,441 | B1 | * | 8/2002 | Yamamoto .................. 257/758 |
| 2001/0005052 | A1 | * | 6/2001 | Hartswick et al. .......... 257/758 |
| 2002/0000664 | A1 | * | 1/2002 | Cheng et al. ............... 257/758 |
| 2002/0040986 | A1 | * | 4/2002 | Sugiyama et al. .......... 257/758 |

* cited by examiner

*Primary Examiner*—Douglas W Owens
(74) *Attorney, Agent, or Firm*—Mark C. Pickering

(57) ABSTRACT

The capacitance of a multilevel metal interconnect formed on a semiconductor substrate can be adjusted, and thereby optimized, to respond to signals from devices that are formed on the underlying substrate by forming capacitive structures in trenches which have been formed using the top metal layer as a mask.

23 Claims, 11 Drawing Sheets

MULTILEVEL METAL INTERCONNECT AND METHOD OF FORMING THE INTERCONNECT WITH CAPACITIVE STRUCTURES THAT ADJUST THE CAPACITANCE OF THE INTERCONNECT

BACKGROUND OF THE INVENTION

1. Field of the Invention

The present invention relates to multilevel metal interconnects and, more particularly, to a multilevel metal interconnect and method of forming the interconnect with capacitive structures that adjust the capacitance of the interconnect.

2. Description of the Related Art

A metal interconnect is a semiconductor structure that electrically connects the individual devices on the semiconductor substrate to realize a desired circuit function. Multiple layers of metal are typically needed to provide the required interconnections, with current-generation integrated circuits often employing up to seven layers of metal.

FIG. 1 shows a cross-sectional view that illustrates a conventional multilevel metal interconnect 100. As shown in FIG. 1, interconnect 100, which is formed on a semiconductor substrate 110, has a first layer of isolation material 112 that is formed on substrate 110, and a number of contacts 114 that are formed through isolation layer 112.

In addition, interconnect 100 also has a patterned first metal (metal-1) layer 116 that is formed on isolation layer 112 and contacts 114. Contacts 114 provide an electrical connection with devices formed in substrate 110, such as a source or a drain region of a MOS transistor, while metal-1 layer 116 provides an electrical connection with contacts 114.

In addition, interconnect 100 has a second layer of isolation material 120, known as an intermetal dielectric, that is formed on metal-1 layer 116, and a number of vias 122 that are formed through isolation layer 120. Interconnect 100 also has a patterned second metal (metal-2) layer 124 that is formed on isolation layer 120 and vias 122. Vias 122 provide an electrical connection between patterned metal-1 layer 116 and patterned metal-2 layer 124.

In a similar fashion, interconnect 100 has third and fourth layers of isolation material 130 and 140, respectively. In addition, a number of vias 132 are formed through isolation layer 130 to contact metal-2 layer 124, and a number of vias 142 are formed through isolation layer 140.

Further, interconnect 100 has a patterned third (metal-3) layer 134 and a patterned fourth metal (metal-4) layer 144, respectively, that are formed to provide an electrical connection with vias 132 and 142, respectively. A passivation layer 146 is formed on the layer of fourth isolation material 140 and metal-4 layer 144.

Interconnect 100 is conventionally formed, in part, by depositing a first layer of metal on a first layer of isolation material and the contacts formed through the first layer of isolation material. Following this, the first layer of metal is patterned to form the patterned first metal layer. Next, a second layer of isolation material is formed on the patterned first metal layer and the first layer of isolation material.

Vias are then formed through the second layer of isolation material to form an electrical connection with the first layer of metal. A second layer of metal is then deposited on the second layer of isolation material and the vias, and the process continues until all of the required metal layers have been formed.

The layers of isolation material can be implemented with the same or different materials. Silicon dioxide (SiO2) is commonly used to form each of the isolation layers. Silicon nitride is also commonly used with silicon dioxide, while many current generation processes use dielectric materials with a dielectric constant (K) that is lower than silicon dioxide.

The layers of isolation material provide electrical isolation between the patterned metal layers as well as between metal lines within a given patterned metal layer. The metal-isolation material-metal structure forms a parasitic capacitor which has a capacitance that is partially defined by the dielectric constant (K) of the type of isolation material that is used.

Horizontally adjacent metal lines from a patterned metal layer have a line-to-line capacitance that is partially defined by the layer of isolation material formed between the metal lines. For example, horizontally adjacent metal lines from patterned metal-3 layer 134 have a line-to-line capacitance Ca that is partially defined by the fourth layer of isolation material 140.

In addition, vertically adjacent metal lines have an interlayer capacitance that is partially defined by the isolation material between the metal lines. For example, vertically adjacent metal lines from metal-3 and metal-4 layers 134 and 144, respectively, have an interlayer capacitance Cb that is partially defined by the fourth layer of isolation material 140.

Further, diagonally adjacent metal lines have a cross coupled capacitance partially defined by the isolation material between the metal lines. For example, diagonally adjacent metal lines from metal-3 and metal-4 layers 134 and 144, respectively, have a cross coupled capacitance Cc partially defined by the fourth layer of isolation material 140.

One problem with interconnect 100, particularly in submicron integrated circuits, is the RC time delay introduced by interconnect 100. The RC time delay, which is dominated by the line-to-line capacitance Ca, the interlevel capacitance Cb, and the cross coupled capacitance Cc, significantly impacts the speed of the electrical circuit that is formed on the underlying substrate.

U.S. Pat. No. 5,449,953 to Nathanson et al. describe a single level "airbridge" connecting structure for interconnecting monolithic microwave integrated circuits. The manufacturing of these highly specialized structures is, however, not compatible with standard CMOS or bipolar semiconductor device interconnect processing and these structures do not provide a supporting layer beneath the "airbridge."

U.S. Pat. No. 6,100,590 to Yegnashankaran et al. describe a multilevel metal interconnect where trenches are utilized to reduce the line-to-line and cross-coupled capacitances Ca and Cc. FIG. 2 shows a cross-sectional view that illustrates a prior-art multilevel metal interconnect 200. FIG. 2 illustrates the multilevel metal interconnect taught by U.S. Pat. No. 6,100,590.

Interconnect 200 is similar to interconnect 100 and, as a result, utilizes the same reference numerals to designate the structures that are common to both structures. As shown in FIG. 2, interconnect 200 differs from interconnect 100 in that interconnect 200 has a first trench 210 and a second trench 220.

First trench 210 is formed between horizontally adjacent metal lines from the patterned metal-4 layer 144, and through the fourth layer of isolation material 140. In addition, first trench 210 is formed between horizontally adjacent metal lines from the patterned metal-3 layer 134, and through the third layer of isolation material 130.

Second trench 220 is formed between horizontally adjacent metal lines from the patterned metal-4 layer 144, and through the fourth layer of isolation material 140. In addition, second trench 220 is formed between horizontally adjacent metal lines from the patterned metal-3 layer 134, and through the third layer of isolation material 130.

Second trench 220 is further formed between horizontally adjacent metal lines from the patterned metal-2 layer 124, and through the second layer of isolation material 120. In addition, second trench 220 is also formed between horizontally adjacent metal lines from the patterned metal-1 layer 116.

Trenches 210 and 220 are filled with air, which has a dielectric constant of 1.0. Compared with silicon dioxide, which has a dielectric constant of 3.9, the air in trenches 210 and 220 significantly reduces the line-to-line capacitance Ca and the cross-coupled capacitance Cc.

The contributions of capacitance Ca and capacitance Cc to the total interconnect related capacitance depend on the particular geometry of the integrated circuit layout (e.g. metal line-to-line spacing, thickness of the interconnect dielectric material between metal layers, etc.). For conventional microprocessors, for example, capacitance Ca and capacitance Cc can account for 60–70% or more of the total capacitance related to interconnect 100.

Since the capacitance related to interconnect 100 is the dominant factor affecting the RC time delay in submicron integrated circuits, the presence of trenches 210 and 220 in the interconnect dielectric material reduces the capacitance related to interconnect 100, thereby increasing device speed.

SUMMARY OF THE INVENTION

The present invention provides a low capacitance multilevel metal interconnect that allows the capacitance of the structure to be adjusted, and thereby optimized, to respond to signals from devices that are formed on the underlying substrate. In the present invention, the capacitance is adjusted by forming capacitive structures in trenches that have been formed in the interconnect.

A multilevel metal interconnect in accordance with the present invention is formed on a semiconductor substrate that has a plurality of active areas. The multilevel metal interconnect includes a plurality of layers of insulation material. The plurality of layers of insulation material include a first layer of insulation material and a top layer of insulation material. The first layer of insulation material is formed on the semiconductor substrate.

The interconnect also includes a corresponding plurality of patterned metal layers that are formed on the layers of insulation material so that each patterned metal layer is formed on a corresponding layer of insulation material. The plurality of patterned metal layers includes a first patterned metal layer and a top patterned metal layer, the first patterned metal layer is formed on the first layer of insulation material.

In addition, the interconnect includes a plurality of contacts that are formed through the first layer of insulation material to make electrical connections with the active areas and the first patterned metal layer. The interconnect further includes a plurality of vias formed through the plurality of layers of insulation material other than the first layer of insulation material. The vias make electrical connections with adjacent patterned metal layers.

In accordance with the present invention, the interconnect further includes a capacitive structure that is formed between adjacent metal lines of a patterned metal layer. The capacitive structure is formed from a dielectric material that is different from one of the layers of insulation material.

The present invention also includes a method of forming a multilevel metal interconnect. The interconnect, which is formed on a semiconductor substrate that has a plurality of active areas, includes a plurality of layers of insulation material. The plurality of layers of insulation material include a first layer of insulation material and a top layer of insulation material. The first layer of insulation material is formed on the semiconductor substrate.

The interconnect also includes a corresponding plurality of patterned metal layers that are formed on the layers of insulation material so that each patterned metal layer is formed on a corresponding layer of insulation material. The plurality of patterned metal layers include a first patterned metal layer and a top patterned metal layer. The first patterned metal layer is formed on the first layer of insulation material.

Further, the interconnect includes a plurality of contacts that are formed through the first layer of insulation material to make electrical connections with the active areas and the first patterned metal layer. In addition, the interconnect includes a plurality of vias that are formed through the plurality of layers of insulation material other than the first layer of insulation material. The vias make electrical connections with adjacent patterned metal layers.

The method comprises the step of etching the layers of insulation material exposed between metal lines in the top patterned metal layer for a predetermined period of time to form a plurality of trenches. Each trench being substantially straight. The method further includes the step of forming a layer of dielectric material in the trenches.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIGS. 3A–6A are plan views illustrating a method of forming a multilevel metal interconnect 300 in accordance with the present invention.

FIGS. 3B–6B are cross-sectional views taken along lines 3B—3B to 6B—6B in FIGS. 3A–6A, respectively, in accordance with the present invention.

FIGS. 3C–6C are cross-sectional views taken along lines 3C—3C to 6C—6C in FIGS. 3A–6A, respectively, in accordance with the present invention.

FIGS. 7A–12A are plan views illustrating a method of forming a metal multilayer interconnect in accordance with a second alternate embodiment of the present invention.

FIGS. 7B–12B are cross-sectional drawings taken along lines 7B—7B to 12B—12B shown in FIGS. 7A–12A, respectively.

DETAILED DESCRIPTION

FIGS. 3A–6A show plan views that illustrate a method of forming a metal multilayer interconnect in accordance with the present invention. FIGS. 3B–6B show cross-sectional drawings taken along lines 3B—3B to 6B—6B shown in FIGS. 3A–6A, respectively. FIGS. 3C–6C show cross-sectional drawings taken along lines 3C—3C to 6C—6C shown in FIGS. 3A–6A, respectively.

Figure 3A:
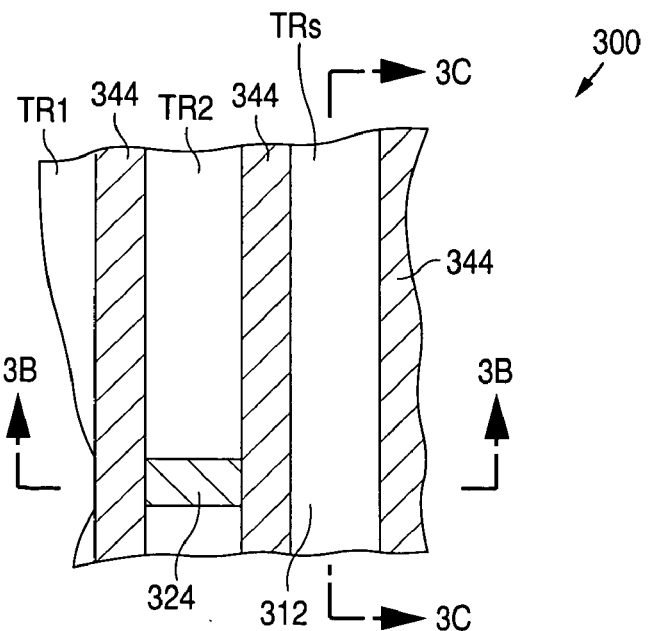
Figure 3B:
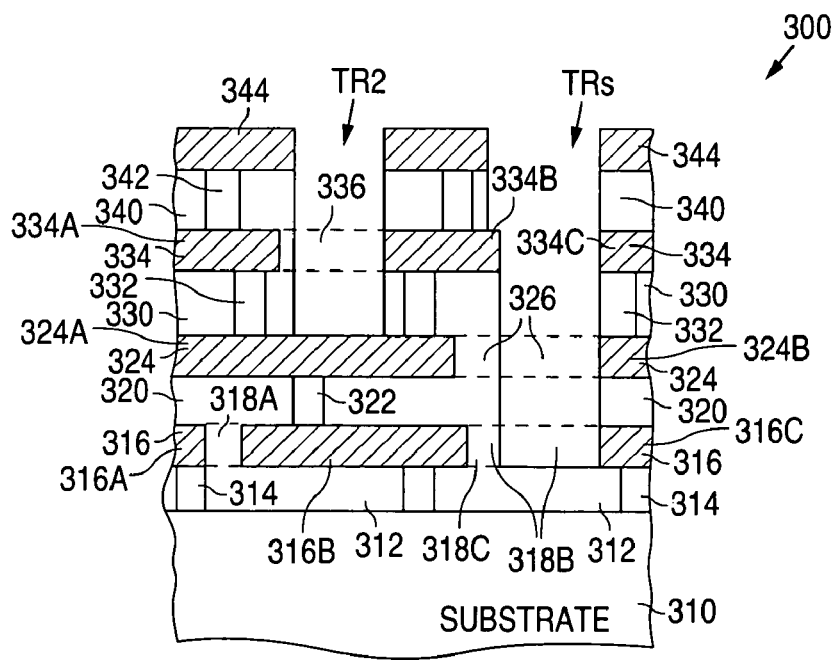
Figure 3C:
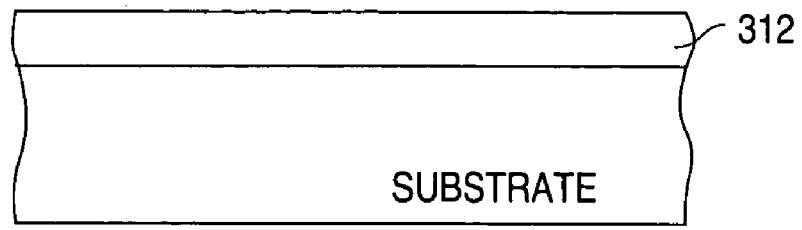

As shown in FIGS. 3A–3C, the method utilizes an interconnect 300 that is conventionally formed on a semiconductor substrate 310. Interconnect 300 includes a first layer of isolation material 312 that is formed on substrate 310, and a number of contacts 314 that are formed through isolation layer 312. Contacts 314 provide an electrical connection to active regions on the surface of substrate 310. Examples of active regions include the source region of a MOS transistor and collector region of a bipolar transistor.

As further shown in FIGS. 3A–3C, interconnect 300 also includes a patterned first metal (metal-1) layer 316 that is formed on isolation layer 312 and contacts 314. In the FIGS. 3A–3C example, patterned metal-1 layer 316 includes a first metal line 316A, a second metal line 316B, and a third metal line 316C. In addition, a first space 318A is defined to lie horizontally entirely between the first and second metal lines 316A and 316B, a second space 318B is defined to lie horizontally entirely between the second and third metal lines 316B and 316C, and a first region 318C is defined to lie within second space 318B and contact a side wall of second metal line 316B.

Further, interconnect 300 includes a second layer of isolation material 320 that is formed on isolation layer 312 and metal-1 layer 316. Interconnect 300 further includes a number of vias 322 that are formed through isolation layer 320, and a patterned second metal (metal-2) layer 324 that is formed on isolation layer 320 and vias 322. Vias 322 provide an electrical connection between patterned metal-1 layer 316 and patterned metal-2 layer 324. In the FIGS. 3A–3C example, patterned metal-2 layer 324 includes a fourth metal line 324A and a fifth metal line 324B. Further, a second region 326 is defined to lie horizontally entirely between the fourth and fifth metal lines 324A and 324B.

In addition, interconnect 300 includes a third layer of isolation material 330 that is formed on isolation layer 320 and metal-2 layer 324, and a number of vias 332 that are formed through isolation layer 330. Interconnect 300 further includes a patterned third metal (metal-3) layer 334 that is formed on isolation layer 330 and vias 332, and a fourth layer of isolation material 340 that is formed on the third layer of isolation material 330 and metal-3 layer 334. Patterned metal-3 layer 334 can include a sixth metal line 334A, a seventh metal line 334B, and an eighth metal line 334C. In addition, a third region 336 is defined to lie horizontally entirely between the sixth and seventh metal lines 334A and 334B. Isolation layers 312, 320, 330, and 340 can be implemented with, for example, a low-K dielectric.

Interconnect 300 also includes a number of vias 342 that are formed through isolation layer 340, and a patterned fourth metal (metal-4) layer 344 that is formed on isolation layer 340 and vias 342. Vias 332 provide an electrical connection between patterned metal-2 layer 324 and patterned metal-3 layer 334, while vias 342 provide an electrical connection between patterned metal-3 layer 334 and patterned metal-4 layer 344. (Although only four layers of metal are shown, the present invention applies any number of metal layers greater than one.)

The configuration or geometry of the patterned metal layers, such as layer thickness, metal line width, and metal line spacing and pitch, depends on the functionality of the integrated circuit device with which the multilevel metal interconnect will be used. In addition, the process technology used to manufacture the multilevel metal interconnect also effects the geometry of the patterned metal layers.

For example, metal-4 layer 344 can be, for example, as thick as 2 microns, while the remaining patterned metal layers that lie underneath can be, for example, 5000 to 6000 angstroms in thickness. The width of the metal lines for a 0.18-micron process technology can be, for example, 0.28 microns. The thickness of the isolation layers separating one patterned metal layer from the next is dependent upon the process technology used to manufacture the multilevel interconnect, and can be, for example, within the range of 6,000 to 10,000 angstroms.

As shown in FIGS. 3A–3C, the method of the present invention begins by anistropically etching interconnect 300 for a predetermined period of time to form a number of trenches TR1–TRs. The anisotropic etch has a high selectivity to metal (i.e. removes interconnect dielectric material at a significantly higher rate than removing metal) to prevent the metal layers from being adversely affected. Trenches TR1–TRs are substantially straight, and adjoin other trenches TR.

The top metal layer, metal-4 layer 344 in this example, functions as a mask for the etching step, with the remaining layers of metal functioning as an etch stop. Thus, depending on the metal patterns in interconnect 300, the bottom surface of a trench TR can have multiple levels, such as trench TR2 (which steps up and over patterned metal-2 layer 324), or a single level such as trench TRs.

Figure 1:
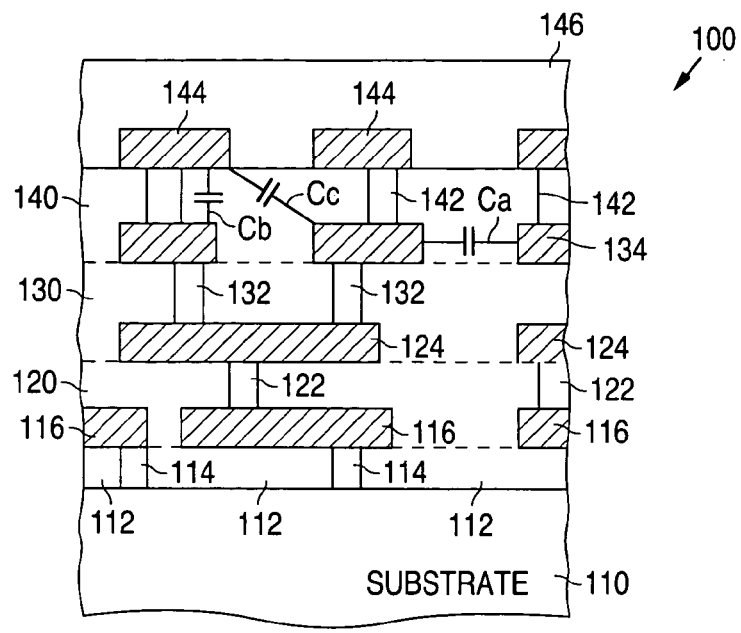
FIG. 1 is a cross-sectional view illustrating a conventional multilevel metal interconnect 100.
Figure 2:
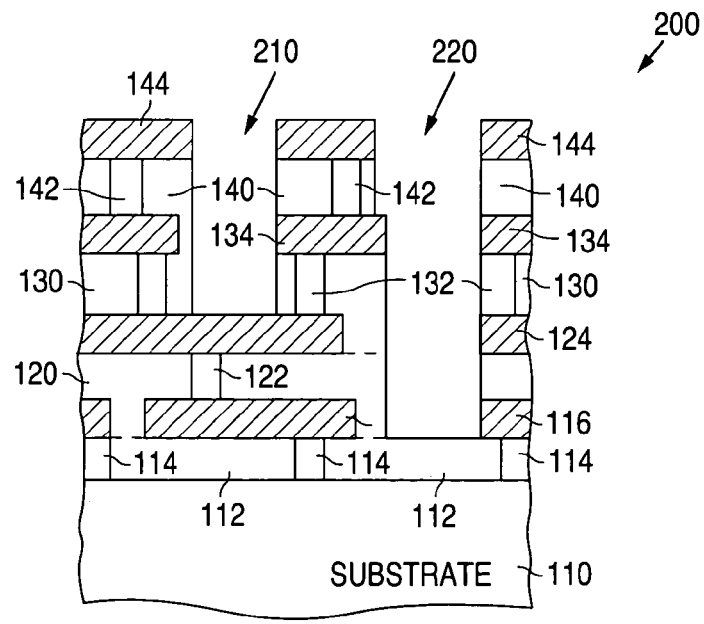
FIG. 2 is a cross-sectional view that illustrates a prior-art multilevel metal interconnect 200.

The predetermined period of time can be set to any time within a range that has a top end that insures that the etching step does not etch into substrate 310. Following the etching step, interconnect 300 is substantially the same as interconnect 200 shown in FIG. 2. As noted above, interconnect 200 illustrates the multilevel metal interconnect taught by U.S. Pat. No. 6,100,590, which is hereby incorporated by reference.

Figure 4A:
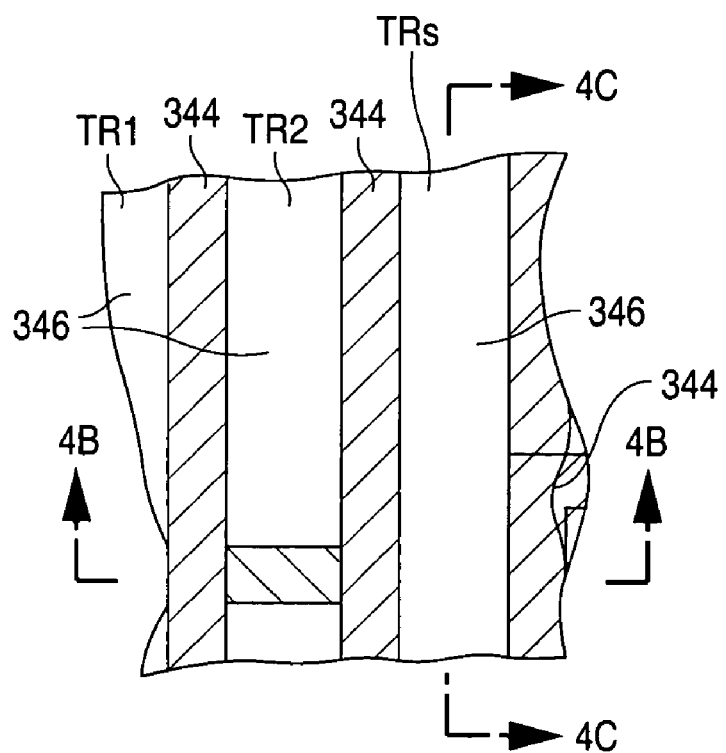
Figure 4B:
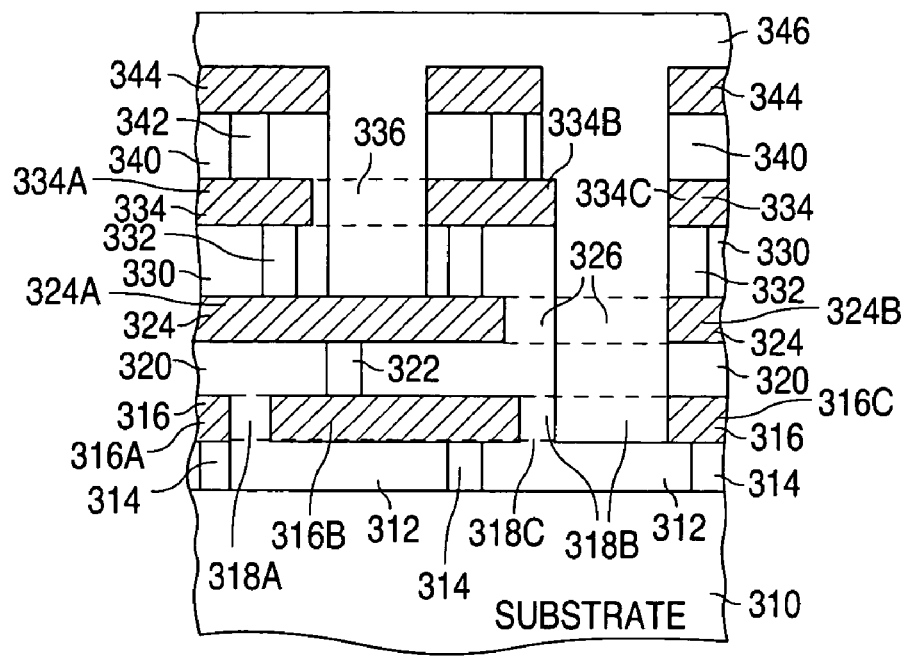
Figure 4C:
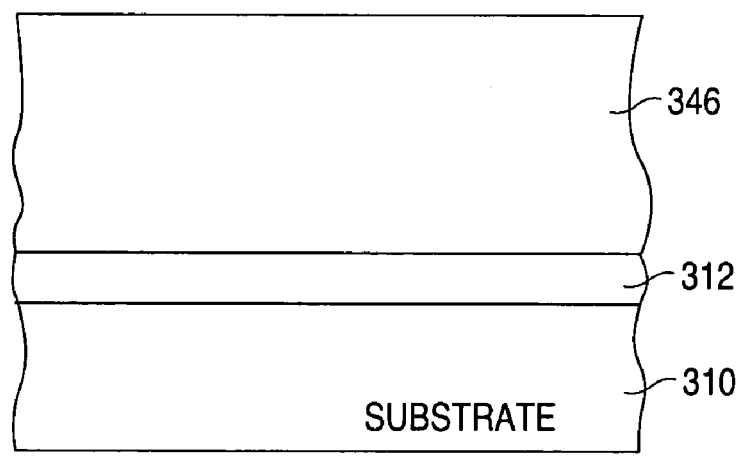

Referring to FIGS. 4A–4C, in accordance with the present invention, a layer of dielectric material 346 is next formed in trenches TR1–TRs. A single type of dielectric material, such as oxide, can be used to fill trenches TR1–TRs, or multiple types of dielectric can be used to fill trenches TR1–TRs (via sequential formation).

In the present invention, dielectric material 346 changes the line-to-line capacitance Ca and the cross coupled capacitance Cc of the metal lines in interconnect 300. As a result, the present invention provides a technique for adjusting the capacitance on a metal line to tune interconnect 300 to the operation of the electrical circuit formed on substrate 310.

Figure 5A:
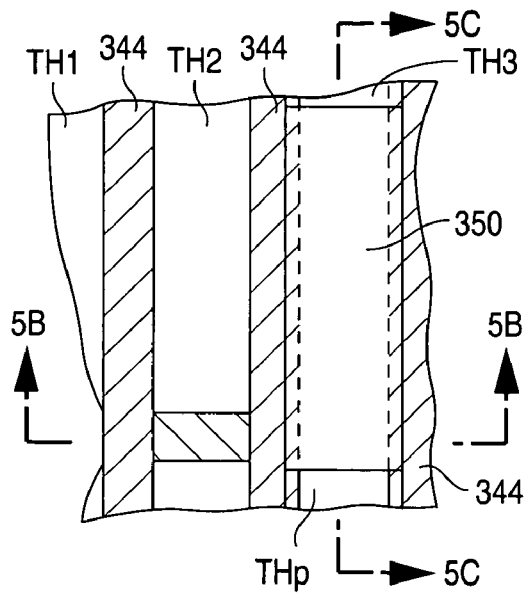
Figure 5B:
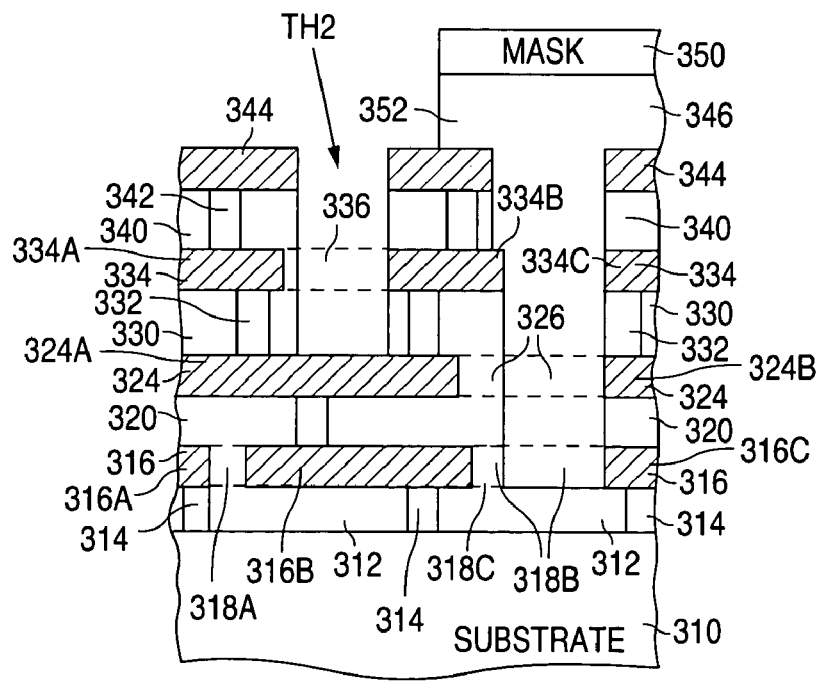
Figure 5C:
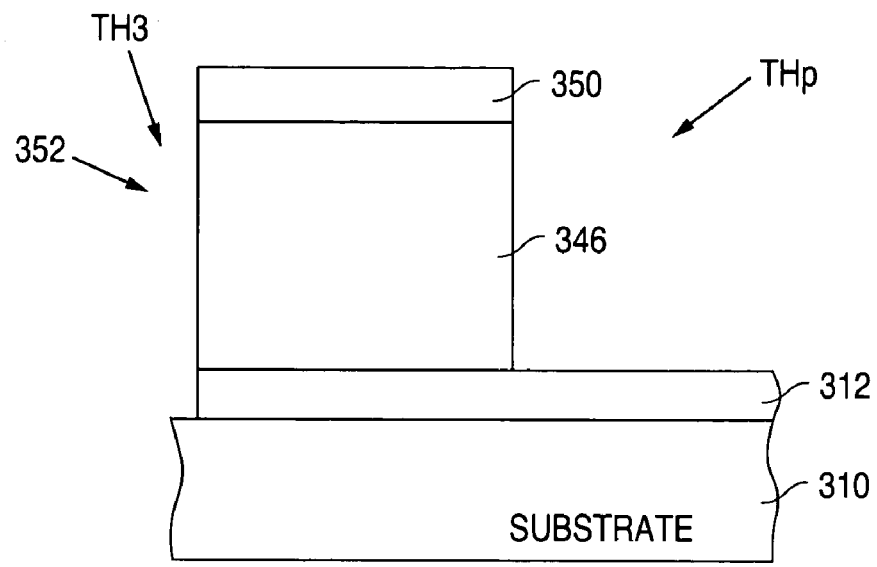

Referring to FIGS. 5A–5C, following the formation of dielectric material 346, a layer of masking material 350 is formed on the layer of dielectric material 346. Once formed, masking layer 350 is patterned to protect a capacitor region on the surface of dielectric material 346.

Following this, the exposed regions of dielectric layer 346 are anisotropically etched to form one or more capacitive structures 352 and a number of trenches TH1–THp. After the etch, masking layer 350 is removed, and the method continues with conventional back end processing steps.

Thus, the present invention provides the air dielectric benefits of U.S. Pat. No. 6,100,590 to Yegnashankaran et al., plus the additional benefit of selectively adding capacitance to interconnect 300 to tune interconnect 300 with respect to the electrical circuit formed on the underlying substrate.

Figure 6A:
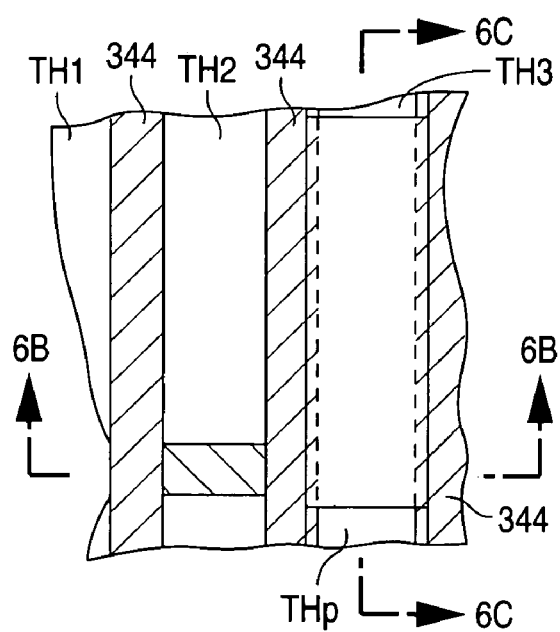
Figure 6B:
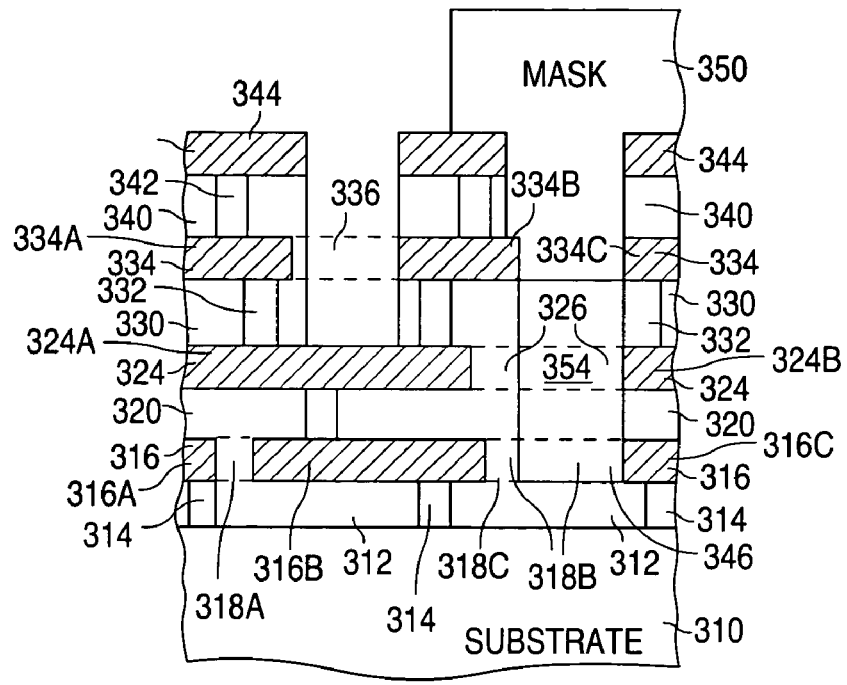
Figure 6C:
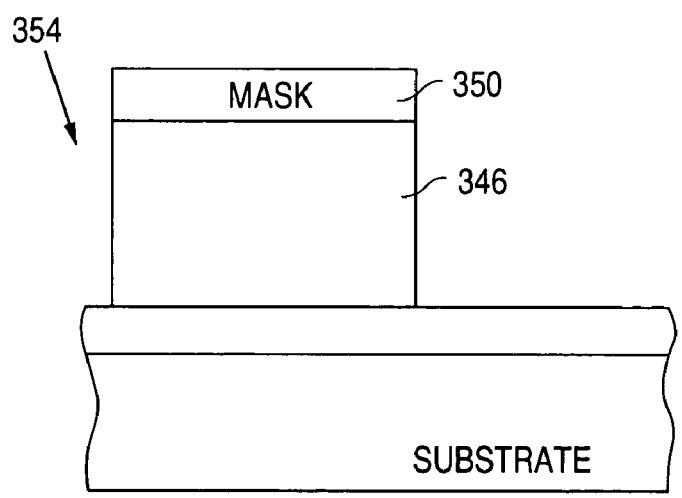

In a first alternate embodiment of the present invention, as shown in FIGS. 6A–6C, dielectric material 346 is anisotropically etched for a predetermined period of time prior to the formation of masking layer 350. By utilizing an anisotropic etch prior to forming the masking layer, a capacitive structure 354 with a shorter step height can be formed.

Figure 7A:
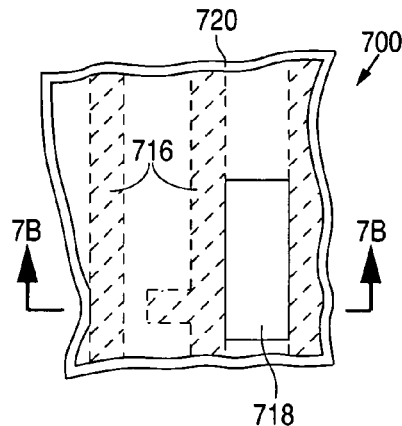

FIGS. 7A–12A show plan views that illustrate a method of forming a metal multilayer interconnect in accordance with a second alternate embodiment of the present invention. FIGS. 7B–12B show cross-sectional drawings taken along lines 7B—7B to 12B—12B shown in FIGS. 7A–12A, respectively. As shown in FIGS. 7A and 7B, the method utilizes an interconnect 700 that is conventionally formed on a semiconductor substrate 710.

Interconnect 700 includes a first layer of isolation material 712 that is formed on substrate 710, and a number of contacts 714 that are formed through isolation layer 712. Contacts 714 provide an electrical connection to active regions on the surface of substrate 710. Interconnect 700 also includes a patterned first metal (metal-1) layer 716 that is formed on isolation layer 712 and contacts 714. In the FIGS. 7A–7B example, patterned metal-1 layer 716 includes a first metal line 716A, a second metal line 716B, and a third metal line 716C. In addition, a first space 717A is defined to lie horizontally entirely between the first and second metal lines 716A and 716B, and a second space 717B is defined to lie horizontally entirely between the second and third metal lines 716B and 716C. Further, interconnect 700 includes a layer of insulation material 718 that is formed on isolation layer 712 and patterned metal-1 layer 716.

Figure 8A:
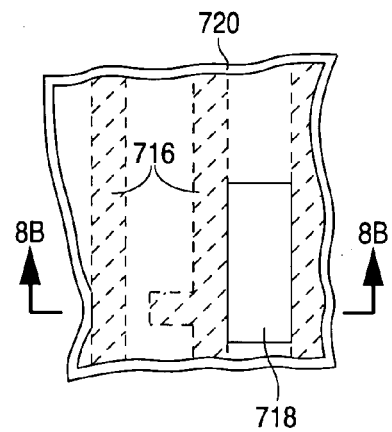
Figure 7B:
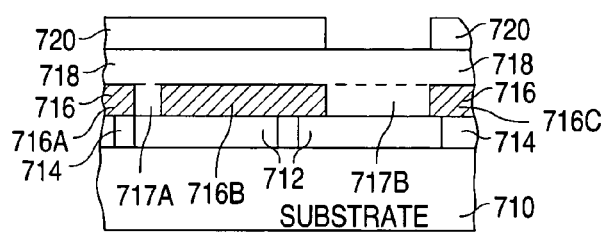
Figure 8B:
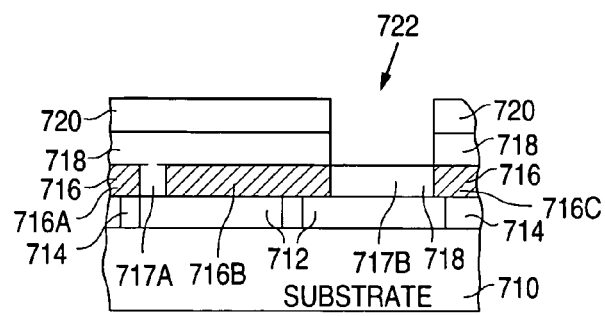

As further shown in FIGS. 7A–7B, the method begins by forming a layer of masking material 720 on insulation layer 718. Once formed, masking layer 720 is patterned to expose a capacitor region on the surface of insulation layer 718. Following this, as shown in FIGS. 8A–8B, the exposed region of insulation layer 718 is anisotropically etched to form a first trench 722. (Care must be taken not to etch into substrate 710.) After the etch, masking layer 720 is removed.

Figure 9A:
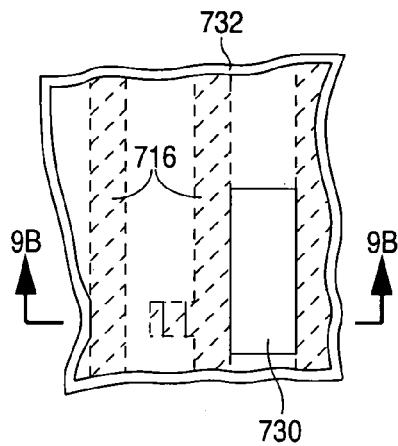
Figure 9B:
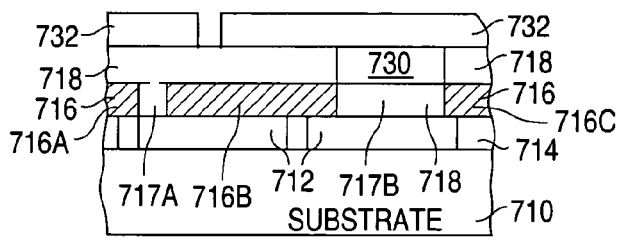

Following this, as shown in FIGS. 9A–9B, a layer of dielectric material, such as oxide, is formed on insulation layer 718 to fill up trench 722, and then etched back to form a dielectric region 730 through insulation layer 718. Dielectric region 730 alters the cross-coupled capacitance Cc. Next, a via mask 732 is formed and patterned on insulation layer 718 and dielectric region 730. Following this, the method continues with conventional steps.

Figure 10A:
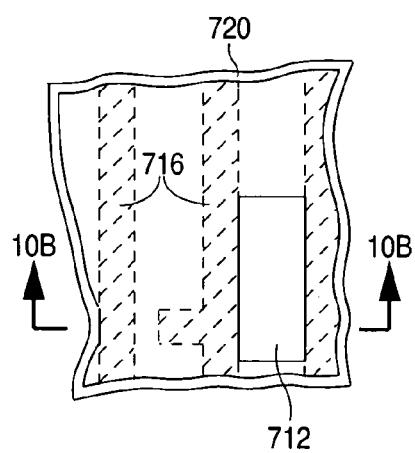
Figure 10B:
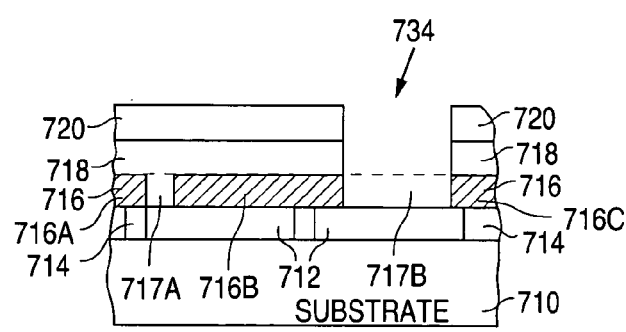
Figure 11A:
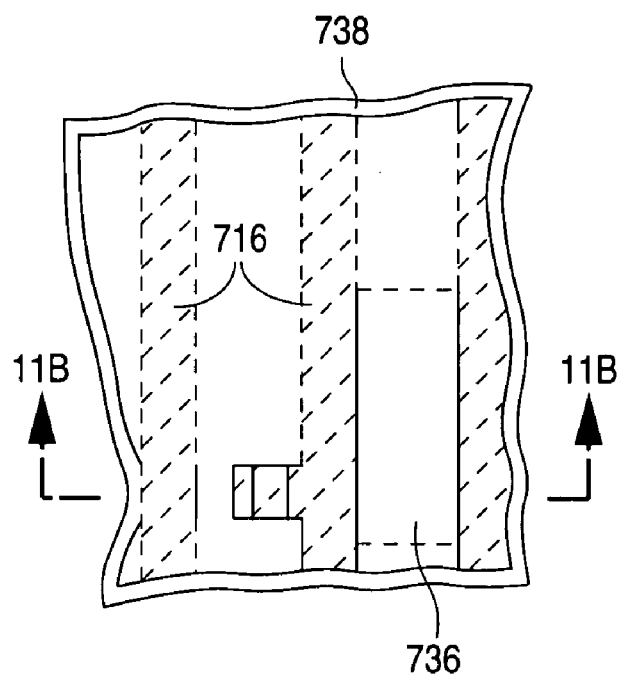
Figure 11B:
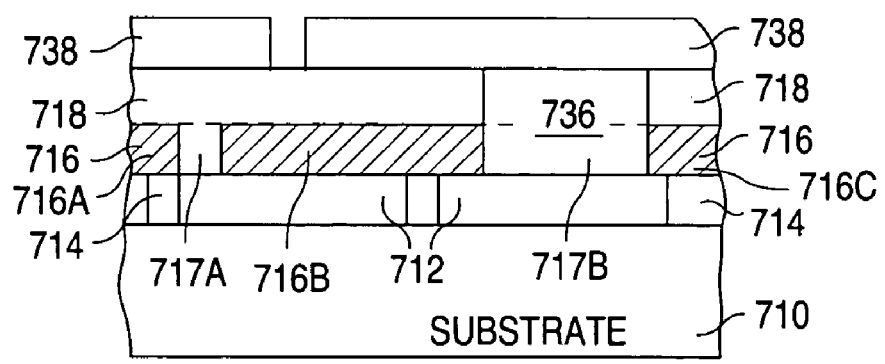

Alternately, as shown in FIGS. 10A–10B, the etching step can be continued for a longer period of time to form a second trench 734. Following the etch, mask 720 is removed. Next, as shown in FIGS. 11A–11B, a layer of dielectric material, such as oxide, is formed on isolation layer 712, insulation layer 718, and patterned metal-1 layer 716 to fill up trench 734. The layer of dielectric material is then etched back to form a dielectric region 736 through insulation layer 718 and between the metal lines of metal-1 layer 716. Dielectric region 736 alters the line-to-line capacitance Ca and the cross-coupled capacitance Cc. Following this, a via mask 738 is formed and patterned on insulation layer 718 and dielectric region 736.

After via mask 738 has been formed, the method continues with conventional back end processing steps. Although the method describes the formation of dielectric regions 730 and 736, a number of dielectric regions can be formed between the metal lines of any patterned metal layer.

Figure 12A:
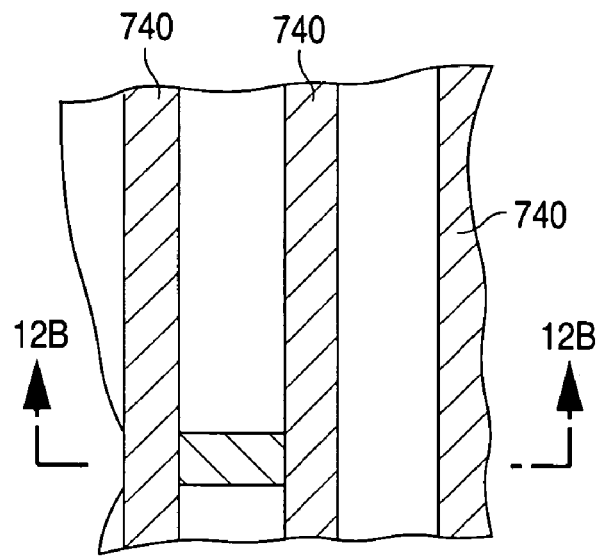
Figure 12B:
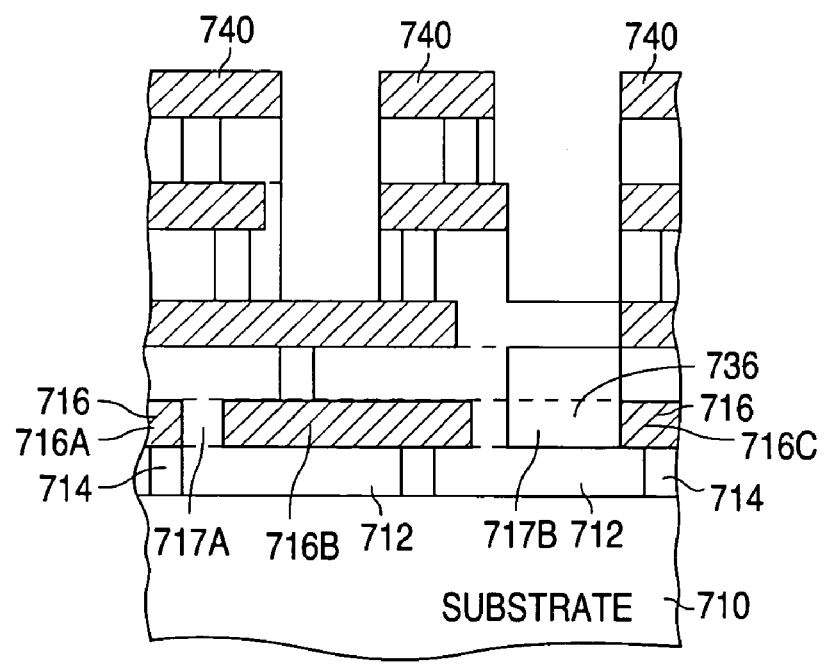

Further, as shown in FIGS. 12A–12B, when a top patterned metal layer 740 has been formed, the resulting interconnect can be anisotropically etched for a predetermined period of time that is insufficient to reach region 736 (or 730), or masked to protect region 736 (or 730) and anisotropically etched for a predetermined period of time.

Thus, a multilevel, metal interconnect and method of forming the structure according to the present invention have been described. The present invention reduces the capacitance related to the interconnect of any CMOS, BiCMOS, or bipolar integrated circuit that includes a multilevel metal interconnect by eliminating a portion of the interconnect dielectric material therein, thereby decreasing the line-to-line capacitance Ca and the cross coupled Cc capacitance components. In addition, the present invention allows capacitance to be selectively added to tune interconnect 300 with respect to the electrical circuit formed on the underlying substrate.

It should be understood that various alternatives to the embodiments of the invention described herein may be employed in practicing the invention. For example, the present invention applies equally to a dual damascene process. It is intended that the following claims define the scope of the invention and that structures and methods within the scope of these claims and their equivalents be covered thereby.

What is claimed is:

1. A multilevel metal interconnect formed on a semiconductor substrate, the semiconductor substrate having a plurality of active areas, the multilevel metal interconnect comprising:

a plurality of layers of insulation material, the plurality of layers of insulation material including a first layer of insulation material and a top layer of insulation material, the first layer of insulation material being formed on the semiconductor substrate;

a corresponding plurality of patterned metal layers formed on the layers of insulation material so that each patterned metal layer is formed on a corresponding layer of insulation material, a patterned metal layer including a plurality of metal lines, the plurality of patterned metal layers including a first patterned metal layer and a top patterned metal layer, the first patterned metal layer being formed on the first layer of insulation material;

a plurality of contacts formed through the first layer of insulation material to make electrical connections with the active areas and the first patterned metal layer;

a plurality of vias formed through the plurality of layers of insulation material other than the first layer of insulation material, the vias making electrical connections with adjacent patterned metal layers;

a dielectric structure formed between laterally adjacent metal lines of a patterned metal layer, the dielectric structure being formed from a dielectric material, the dielectric material being different from one of the layers of insulation material; and a plurality of trenches formed in the layers of insulation material, each trench adjoining metal lines of the top patterned metal layer, a trench extending from the top metal layer between metal lines of the top metal layer through the top insulation layer and between metal lines of a metal layer lying below the top metal layer, each trench having a bottom surface, the trenches not including conductive material.

2. The multilevel metal interconnect of claim 1 wherein the bottom surface has a single level.

3. The multilevel metal interconnect of claim 1 wherein the bottom surface has multiple levels.

4. The multilevel metal interconnect of claim 1 wherein the bottom surface of the trench is spaced apart from a top surface of the semiconductor substrate.

5. The multilevel metal interconnect of claim 1 wherein the dielectric structure is formed adjacent to a trench.

6. The multilevel metal interconnect of claim 1 wherein the dielectric structure is formed between a pair of adjacent trenches.

7. A multilevel metal interconnect formed on a semiconductor substrate, the semiconductor substrate having a plurality of active areas, the multilevel metal interconnect comprising:
   a plurality of layers of insulation material, the plurality of layers of insulation material including a first layer of insulation material and a top layer of insulation material, the first layer of insulation material being formed on the semiconductor substrate;
   a corresponding plurality of patterned metal layers formed on the layers of insulation material so that each patterned metal layer is formed on a corresponding layer of insulation material, the plurality of patterned metal layers including a first patterned metal layer and a top patterned metal layer, the first patterned metal layer being formed on the first layer of insulation material;
   a plurality of contacts formed through the first layer of insulation material to make electrical connections with the active areas and the first patterned metal layer;
   a plurality of vias formed through the plurality of layers of insulation material other than the first layer of insulation material, the vias making electrical connections with adjacent patterned metal layers;
   a dielectric structure formed between adjacent metal lines of a patterned metal layer, the dielectric structure comprising a dielectric material, the dielectric material being different from one of the layers of insulation material; and
   a plurality of trenches formed in the layers of insulation material, a first trench being filled with air and a second trench being filled with the dielectric material.

8. A multilevel metal interconnect comprising:
   a layer of isolation material;
   a first plurality of metal lines that lie in substantially a first horizontal plane, the first plurality of metal lines including first, second, and third metal lines formed on the layer of isolation material, the first, second, and third metal lines each having a top surface, a bottom surface, and side wall surfaces that contact the top and bottom surfaces;
   a first dielectric material, the first dielectric material being formed between the first and second metal lines so that the first dielectric material contacts the side wall surface of the first metal line at a point and extends horizontally from the point to contact a first side wall surface of the second metal line, lying in a first region that lies horizontally entirely between the second and third metal lines so that the first dielectric material contacts a second side wall surface of the second metal line, and contacting the top surfaces of the second and third metal lines, the first dielectric material not extending horizontally from any point on the second side wall surface of the second metal line to contact the side wall surface of the third metal line; and
   a second dielectric material formed over the first region, the second dielectric material contacting the first dielectric material and having a dielectric constant different from a dielectric constant of the first dielectric material.

9. The multilevel metal interconnect of claim 8 and further comprising a second plurality of metal lines that lie in substantially a second plane, the second plurality of metal lines including fourth and fifth metal lines that contact the first dielectric material, the fourth and fifth metal lines each having a top surface, a bottom surface, and side wall surfaces.

10. The multilevel metal interconnect of claim 9 wherein the second dielectric material is formed in a second region that lies horizontally entirely between the fourth metal line and the fifth metal line.

11. The multilevel metal interconnect of claim 10 wherein the second region includes the first dielectric material such that the first dielectric material contacts the fifth metal line.

12. The multilevel metal interconnect of claim 10 wherein the second dielectric material is formed on and over the second region.

13. A multilevel metal interconnect comprising:
   a first plurality of metal lines that lie in substantially a first horizontal plane, the first plurality of metal lines having first surfaces and including first, second, and third metal lines;
   a second plurality of metal lines that lie in substantially a second horizontal plane, the second plurality of metal lines having second and third surfaces, and including fourth, fifth, and sixth metal lines;
   a first dielectric material that contacts the first surfaces of the first, second, and third metal lines and the second surfaces of the fourth, fifth, and sixth metal lines;
   a second dielectric material formed between the first and second metal lines and the fourth and fifth metal lines, the second dielectric material extending from a point on the first horizontal plane between the first and second metal lines to a point on the second horizontal plane between the fourth and fifth metal lines, the first dielectric material and the second dielectric material having a different dielectric constant; and
   a third dielectric material formed between the second and third metal lines and the fifth and sixth metal lines, the third dielectric material extending from a point on the first horizontal plane between the second and third metal lines to a point on the second horizontal plane between the fifth and sixth metal lines, the second dielectric material and the third dielectric material having a different dielectric constant.

14. The multilevel metal interconnect of claim 13 and further comprising a fourth dielectric material that contacts the third surfaces of the fourth, fifth, and sixth metal lines, the fourth dielectric material having a fourth dielectric constant.

15. The multilevel metal interconnect of claim 14 wherein the fourth dielectric material and the first dielectric material are equivalent.

16. The multilevel metal interconnect of claim 14 and further comprising a third plurality of metal lines that lie in substantially a third horizontal plane, the third plurality of metal lines contacting the fourth dielectric material and including seventh and eighth metal lines.

17. The multilevel metal interconnect of claim 16 wherein the third dielectric material extends from the point on the second horizontal plane between the fifth and sixth metal lines to a point on the third horizontal plane between the seventh and eighth metal lines.

18. A multilevel metal interconnect comprising:
   a first plurality of metal lines that lie in substantially a first horizontal plane, the first plurality of metal lines having first surfaces and including first, second, and third metal lines;
   a second plurality of metal lines that lie in substantially a second horizontal plane, the second plurality of metal lines having second and third surfaces, and including fourth and fifth metal lines;

a third plurality of metal lines that lie in substantially a third horizontal plane, the third plurality of metal lines having fourth surfaces, and including sixth, seventh, and eighth metal lines;

a first dielectric material that contacts the first surfaces of the first, second, and third metal lines and the second surfaces of the fourth and fifth metal lines;

a second dielectric material that contacts the third surfaces of the fourth and fifth metal lines and the fourth surfaces of the sixth, seventh, and eighth metal lines;

a third dielectric material formed within a region that lies in the first horizontal plane between the first and second metal lines;

a fourth dielectric material formed between the second and third metal lines, and the fourth and fifth metal lines, the fourth dielectric material extending from a point on the first horizontal plane between the second and third metal lines to a point on the second horizontal plane between the fourth and fifth metal lines, the fourth dielectric material and the third dielectric material having a different dielectric constant; and a fifth dielectric material formed within a region that lies in the third horizontal plane between the sixth and seventh metal lines, the fifth dielectric material and the fourth dielectric material having a different dielectric constant.

19. The multilevel metal interconnect of claim 18 and further comprising a sixth dielectric material formed within a region that lies in the third horizontal plane between the seventh and eighth metal lines, the sixth dielectric material and the fourth dielectric material having a different dielectric constant.

20. The multilevel metal interconnect of claim 19 wherein the sixth dielectric material and the fifth dielectric material are equivalent.

21. The multilevel metal interconnect of claim 18 wherein the fifth dielectric material contacts a surface of the fourth metal line.

22. The multilevel metal interconnect of claim 18 wherein the third dielectric material is also formed within a region that lies in the first horizontal plane between the second and third metal lines.

23. The multilevel metal interconnect of claim 18 comprising a dielectric region that contacts the fourth and fifth metal lines and lies within the second horizontal plane, the dielectric region having only the first dielectric material.

* * * * *

UNITED STATES PATENT AND TRADEMARK OFFICE
CERTIFICATE OF CORRECTION

PATENT NO. : 7,042,092 B1  Page 1 of 1
APPLICATION NO. : 10/010696
DATED : May 9, 2006
INVENTOR(S) : Yegnashankaran et al.

It is certified that error appears in the above-identified patent and that said Letters Patent is hereby corrected as shown below:

<u>Title Page, Item [54] and Column 1, Lines 2 and 3,</u>
Title, delete "AND METHOD OF FORMING THE INTERCONNECT".

Signed and Sealed this

Fourth Day of July, 2006

JON W. DUDAS
*Director of the United States Patent and Trademark Office*